United States Patent [19]
Kobayashi et al.

[11] Patent Number: 5,831,219
[45] Date of Patent: Nov. 3, 1998

[54] JOINT STRUCTURE FOR MULTILAYER INTERCONNECTIONS

[75] Inventors: Takeshi Kobayashi; Mikio Mukai, both of Kanagawa, Japan

[73] Assignee: Sony Corporation, Japan

[21] Appl. No.: 696,180

[22] Filed: Aug. 13, 1996

[30] Foreign Application Priority Data

Aug. 15, 1995 [JP] Japan .................................... 7-208225

[51] Int. Cl.$^6$ ............................................ H01R 9/09
[52] U.S. Cl. ........................ 174/261; 361/803; 174/250
[58] Field of Search .................................... 174/262, 263, 174/264, 265, 266, 261, 257, 250, 94 R; 361/803; 439/66, 74, 591, 91

[56] References Cited

U.S. PATENT DOCUMENTS

| | | | |
|---|---|---|---|
| 4,761,517 | 8/1988 | Massit et al. ............................. | 174/36 |
| 4,879,433 | 11/1989 | Gillett et al. ............................. | 174/268 |
| 5,219,639 | 6/1993 | Sugawara et al. ....................... | 428/209 |
| 5,306,872 | 4/1994 | Kordus et al. .......................... | 174/250 |

*Primary Examiner*—Bot L. Ledynh
*Assistant Examiner*—Kristina Soderquist
*Attorney, Agent, or Firm*—Ronald P. Kananen

[57] ABSTRACT

A lower-layer interconnection and an upper-layer interconnection formed on the lower-layer interconnection through an interlayer insulating film interposed therebetween are connected to each other by a plurality of contact plugs the interconnections and the contact plugs providing a plurality of conductive paths. The lower-layer interconnection is made of a conductive material having a resistivity higher than the upper-layer interconnection. At least one of the conductive paths provided in the lower-layer interconnections is shorter than the other conductive paths, and the contact plug which provides the shorter conductive path has a lower resistance than the contact plugs which provide the other conductive paths. With this arrangement, the contact plug which provides the shorter conductive path is prevented from suffering an increased current density, and the current densities in the contact plugs are uniformized.

11 Claims, 4 Drawing Sheets

JOINT STRUCTURE FOR MULTILAYER INTERCONNECTIONS

BACKGROUND OF THE INVENTION

The present invention relates to a joint structure for multilayer interconnections in a semiconductor device or the like, and more particularly to a joint structure by which an upper-layer interconnection and a lower-layer interconnection are connected to each other by a plurality of contact plugs in a single joint region.

Some highly integrated semiconductor devices employ multilayer interconnections that are indispensable for avoiding an increase in an area occupied for the formation of interconnections. For connecting an upper-layer interconnection and a lower-layer interconnection to each other through an interlayer insulating film interposed therebetween, it has been customary to define connection holes referred to as through holes or via holes in the interlayer insulating film, and embedding in the connection holes contact plugs made of a conductive material which may be of the same type as or of a different type from the material of the upper-layer interconnection, thereby electrically connecting the contact plugs to the upper-layer interconnection. The contact plugs may be embedded in the connection holes at the same time that the upper-layer interconnection is formed or may first be embedded in the connection holes, producing a substantially flat surface, on which the upper-layer interconnection will subsequently be formed. According to the related art joint structure for multilayer interconnections, it has been the general practice to define one connection hole in one joint region and embed one contact plug in the connection hole thus defined.

In a joint structure for a power supply line having a large current capacity, an interconnection has a large width and a connection hole has a large diameter. When a conductive material is embedded in such a large connection hole thereby to form a contact plug therein, the formed contact plug tends to develop a recess centrally therein, posing a problem on the central coverage of an upper-layer interconnection. To avoid this drawback, it has been the related art practice in joining multilayer interconnections for power supply lines to define a plurality of connection holes of the same small diameter in one joint region, and then embed a plurality of contact plugs of a conductive material in the respective connection holes, thereby connecting upper- and lower-layer interconnections.

For flattening the surface of an interlayer insulating film on the lower-layer interconnection, it is known to deposit an interlayer insulating material as silicate glass such as PSG (Phospho-Silicate-Glass) or the like by way of reflow, or heat a coated insulating film such as a SOG (Spin-On-Glass) coating for densifying same. According to the above general practice, Al(aluminum)-based metals having low melting points cannot be used as the material of the lower-layer interconnection, but a refractory metal such as W (Tungsten), Ti (Titanium), or the like which is highly resistant to heat, or its silicide or polycide, or polycrystalline silicon is used as the material of the lower-layer interconnection. These heat-resistant conductive materials have resistivities which are one or two figures greater than those of Al-based metals.

However, when a lower-layer interconnection made of a high-resistivity conductive material and an upper-layer interconnection of a low-resistivity conductive material such as an Al-based metal are connected to each other by a plurality of contact plugs of the same diameter in one joint region, certain problems occur as shown in FIGS. 4A and 4B of the accompanying drawings, which are plan and cross-sectional views, respectively, of a related art joint structure for multilayer interconnections.

As shown in FIGS. 4A and 4B, a lower-layer interconnection 1 made of a high-resistivity conductive material and an upper-layer interconnection 2 of a low-resistivity conductive material such as an Al-based metal are connected to each other by four contact plugs $C_1$–$C_4$ of the same diameter in one joint region. Within the lower-layer interconnection 1, a conductive path 3a via the contact plugs $C_1$, $C_2$ is shorter than a conductive path 3b via the contact plugs $C_3$, $C_4$ by a length "l" shown in FIG. 4B.

Since the conductive path 3a via the contact plugs $C_1$, $C_2$ serves as a current passage which has a lower resistance than the conductive path 3b via the contact plugs $C_3$, $C_4$, a current concentrates on the contact plugs $C_1$, $C_2$ and hence a current density in the contact plugs $C_1$, $C_2$ increases. As a consequence, the contact plugs $C_1$, $C_2$ are liable to burn out due to the Joule heat which is generated by the intensive current. When the contact plugs $C_1$, $C_2$ burn out, the interconnections are broken, resulting in a reduction in the reliability or a failure of the semiconductor device.

SUMMARY OF THE INVENTION

It is therefore an object of the present invention to provide a joint structure for multilayer interconnections which prevents an undue increase in the current density in certain contact plugs for thereby avoiding damage or breakage of interconnections and hence a device which incorporates such interconnections.

To achieve the above object, there is provided in accordance with the present invention a joint structure for multilayer interconnections, comprising a lower-layer interconnection, an upper-layer interconnection formed on the lower-layer interconnection through an interlayer insulating film interposed therebetween, one of the lower-layer interconnection and the upper-layer interconnection being made of a conductive material having a resistivity higher than the other of the lower-layer interconnection and the upper-layer interconnection, and providing a plurality of conductive paths, the lower-layer interconnection and the upper-layer interconnection being connected to each other by the contact plugs, wherein at least one of the conductive paths provided in the one of the interconnections which is made of the conductive material having the higher resistivity is shorter than the other conductive paths, and the contact plug which provides the at least one of the conductive paths has a lower resistance than the contact plugs which provide the other conductive paths.

Even when a current concentrates on the contact plug which provides the at least one of the conductive paths, the amount of Joule heat generated by the contact plug is relatively low because of its lower resistance, and hence the contact plug is prevented from being damaged.

The contact plug which provides the at least one of the conductive paths may have a shape in plan which has a greater area than shapes in plan of the contact plugs which provide the other conductive paths.

Therefore, even when a current concentrates on the contact plug which provides the at least one of the conductive paths, the current density in the contact plug is prevented from being unduly increased, and the current densities in the contact plugs are uniformized. The amount of Joule heat generated by the contact plug is relatively low because of its lower resistance, and hence the contact plug is prevented from being damaged.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1A:
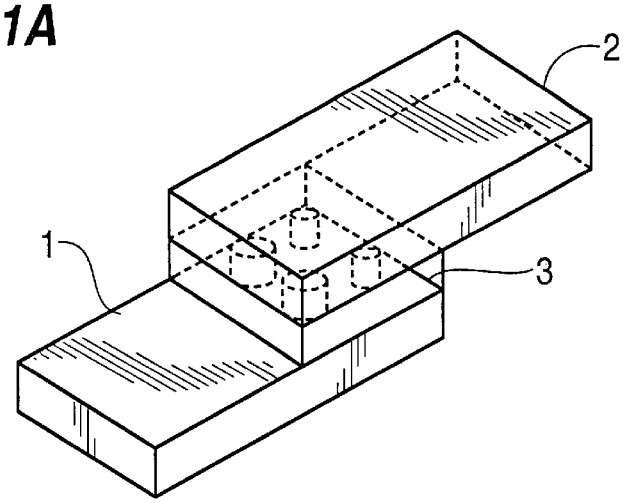
FIG. 1A is a perspective view of a joint structure for multilayer interconnections according to first and second embodiments of the present invention.

Like or corresponding parts are denoted by like or corresponding reference numerals throughout views.

In each of all embodiments described below, a joint structure for multilayer interconnections consists of a lower-layer interconnection of a high-resistivity conductive material which has dimensions shown in Table 1 given below, an upper-layer interconnection of a low-resistivity conductive material which has dimensions shown in Table 1, and four contact plugs by which the upper- and lower-layer interconnections are connected to each other in one joint region. Within the lower-layer interconnection, a conductive path via two out of the four contact plugs is shorter, and a conductive path via the other two out of the four contact plugs is longer.

TABLE 1

|  | Width | Length | Thickness |
|---|---|---|---|
| Upper-layer interconnection | 3.0 | 7.5 | 0.7 |
| Lower-layer interconnection | 3.0 | 7.5 | 0.6 |

(unit: μm)

Figure 1B:
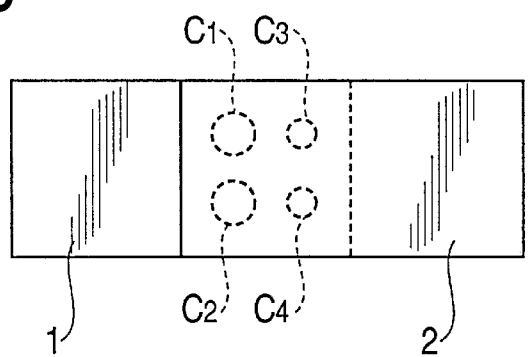
FIG. 1B is a plan view of the joint structure for multilayer interconnections shown in FIG. 1A.

1st embodiment:

According to a first embodiment of the present invention, as shown in FIGS. 1A and 1B, a joint structure for multilayer interconnections consists of a lower-layer interconnection 1 of Ti (having a resistivity of 60 Ωcm), an upper-layer interconnection 2 of Al (having a resistivity of 3 Ωcm) extending in the direction in which the lower-layer interconnection extends and overlaps the lower-layer interconnection 1 only at an end thereof, and four contact plugs $C_1$–$C_4$ of Al by which the upper- and lower-layer interconnections are connected to each other in one joint region. The contact plugs $C_1$–$C_4$ may be formed by defining four via holes in an interlayer insulating film on the lower-layer interconnection 1 and depositing Al in the via holes according to high-temperature sputtering or high-temperature evaporation.

As shown in FIGS. 1A and 1B, the lower-layer interconnection 1 and the upper-layer interconnection 2 are connected by four conductive paths which are provided in one joint region by the four contact plugs $C_1$, $C_2$, $C_3$, $C_4$ that are circular in shape when viewed in plan. The conductive paths provided by the contact plugs $C_1$, $C_2$ in the lower-layer interconnection 1 are shorter, and these contact plugs $C_1$, $C_2$ have a radius of 0.35 μm. The conductive paths provided by the other contact plugs $C_3$, $C_4$ in the lower-layer interconnection 1 are longer, and these contact plugs $C_3$, $C_4$ have a radius of 0.25 μm.

Figure 1C:
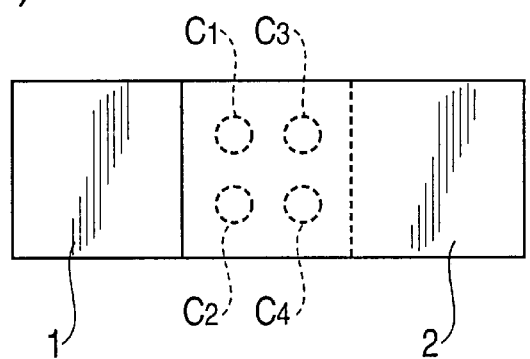
FIG. 1C is a plan view of a joint structure for multilayer interconnections according to a first comparative example.

FIG. 1C shows a comparative example which is similar to the joint structure for multilayer interconnections according to the first embodiment except that all four of the contact plugs $C_1$, $C_2$, $C_3$, $C_4$ have a radius of 0.30 μm.

The contact plugs of the joint structure for multilayer interconnections according to the first embodiment and those of the comparative example were measured for the densities of currents flowing through the contact plugs and the totals thereof. The results are shown in Table 2 below.

TABLE 2

|  | 1st embodiment | Comparative example |
|---|---|---|
| Contact plug $C_1$ | 2.883 | 3.806 |
| Contact plug $C_2$ | 2.834 | 3.795 |
| Contact plug $C_3$ | 1.048 | 0.9403 |
| Contact plug $C_4$ | 1.103 | 0.9795 |
| Total currents | 0.01661 | 0.01684 |

(unit: current density: × $10^3$ A/μm², current: A)

As can be seen from Table 2 above, the densities of the current flowing through the contact plugs $C_1$, $C_2$, which are relatively large in the comparative example, are reduced according to the first embodiment of the present invention.

2nd embodiment:

A joint structure for multilayer interconnections according to a second embodiment of the present invention is similar to the joint structure for multilayer interconnections according to the first embodiment of the present invention except that the lower-layer interconnection 1 is made of W (having a resistivity of 10 Ωcm). The contact plugs of the joint structure for multilayer interconnections according to the second embodiment and those of a comparative example, which is similar to the joint structure for multilayer interconnections according to the second embodiment except that all the four contact plugs $C_1$, $C_2$, $C_3$, $C_4$ have a radius of 0.30 μm, were measured for the densities of currents flowing through the contact plugs and the totals thereof. The results are shown in Table 3 below.

TABLE 3

|  | 2nd embodiment | Comparative example |
| --- | --- | --- |
| Contact plug $C_1$ | 11.67 | 14.52 |
| Contact plug $C_2$ | 11.50 | 14.50 |
| Contact plug $C_3$ | 9.280 | 8.361 |
| Contact plug $C_4$ | 9.119 | 7.973 |
| Total currents | 0.08590 | 0.08741 |

(unit: current density: $\times 10^3$ A/$\mu$m$^2$, current: A)

As can be seen from Table 3 above, the densities of the current flowing through the contact plugs $C_1$, $C_2$, which are relatively large in the comparative example, are reduced according to the second embodiment of the present invention.

Figure 2A:
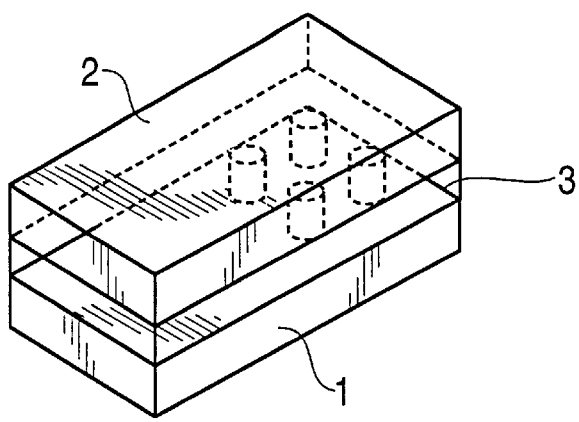
FIG. 2A is a perspective view of a joint structure for multilayer interconnections according to third and fourth embodiments of the present invention.
Figure 2B:
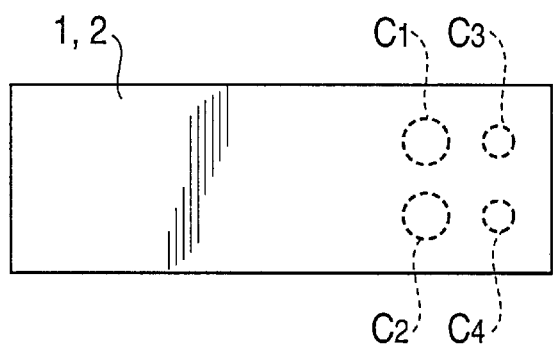
FIG. 2B is a plan view of the joint structure for multilayer interconnections shown in FIG. 2A.

3rd embodiment:

According to a third embodiment of the present invention, as shown in FIGS. 2A and 2B, a joint structure for multilayer interconnections consists of a lower-layer interconnection 1 of Ti (having a resistivity of 60 Ωcm), an upper-layer interconnection 2 of Al (having a resistivity of 3 Ωcm) extending in the direction in which the lower-layer interconnection 1 extends and overlaps the lower-layer interconnection 1 in its entirety, and four contact plugs $C_1$–$C_4$ of Al by which the upper- and lower-layer interconnections are connected to each other in one joint region. The contact plugs $C_1$–$C_4$ may be formed by defining four via holes in an interlayer insulating film on the lower-layer interconnection 1 and depositing Al in the via holes according to high-temperature sputtering.

As shown in FIGS. 2A and 2B, the lower-layer interconnection 1 and the upper-layer interconnection 2 are connected by four conductive paths which are provided in one joint region by the four contact plugs $C_1$, $C_2$, $C_3$, $C_4$ that are circular in shape when viewed in plan. The conductive paths provided by the contact plugs $C_1$, $C_2$ in the lower-layer interconnection 1 are shorter, and these contact plugs $C_1$, $C_2$ have a radius of 0.35 $\mu$m. The conductive paths provided by the other contact plugs $C_3$, $C_4$ in the lower-layer interconnection 1 are longer, and these contact plugs $C_3$, $C_4$ have a radius of 0.25 $\mu$m.

Figure 2C:
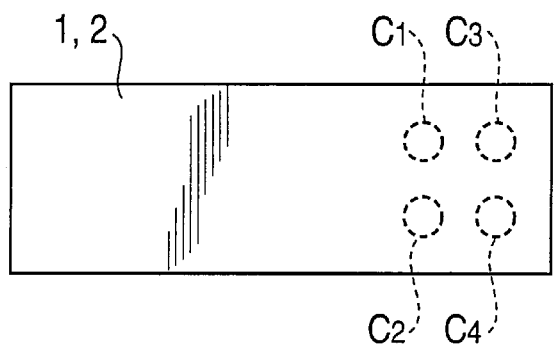
FIG. 2C is a plan view of a joint structure for multilayer interconnections according to a second comparative example.

FIG. 2C shows a comparative example which is similar to the joint structure for multilayer interconnections according to the third embodiment except that all four of the contact plugs $C_1$, $C_2$, $C_3$, $C_4$ have a radius of 0.30 $\mu$m.

The contact plugs of the joint structure for multilayer interconnections according to the third embodiment and those of the comparative example were measured for the densities of currents flowing through the contact plugs and the totals thereof. The results are shown in Table 4 below.

TABLE 4

|  | 3rd embodiment | Comparative example |
| --- | --- | --- |
| Contact plug $C_1$ | 2.651 | 3.462 |
| Contact plug $C_2$ | 2.664 | 3.546 |
| Contact plug $C_3$ | 0.9659 | 0.9309 |
| Contact plug $C_4$ | 1.062 | 0.9097 |
| Total currents | 0.01684 | 0.01661 |

(unit: current density: $\times 10^3$ A/$\mu$m$^2$, current: A)

As can be seen from Table 4 above, the densities of the current flowing through the contact plugs $C_1$, $C_2$, which are relatively large in the comparative example, are reduced according to the third embodiment of the present invention.

4th embodiment:

A joint structure for multilayer interconnections according to a fourth embodiment of the present invention is similar to the joint structure for multilayer interconnections according to the third embodiment of the present invention except that the lower-layer interconnection 1 is made of W (having a resistivity of 10 Ωcm). The contact plugs of the joint structure for multilayer interconnections according to the fourth embodiment and that of a comparative example, which is similar to the joint structure for multilayer interconnections according to the third embodiment except that all four of the contact plugs $C_1$, $C_2$, $C_3$, $C_4$ have a radius of 0.30 $\mu$m, were measured for the densities of currents flowing through the contact plugs and the totals thereof. The results are shown in Table 5 below.

TABLE 5

|  | 4th embodiment | Comparative example |
| --- | --- | --- |
| Contact plug $C_1$ | 12.04 | 14.97 |
| Contact plug $C_2$ | 12.01 | 15.11 |
| Contact plug $C_3$ | 6.505 | 6.301 |
| Contact plug $C_4$ | 7.010 | 6.262 |
| Total currents | 0.08103 | 0.07957 |

(unit: current density: $\times 10^3$ A/$\mu$m$^2$, current: A)

As can be seen from Table 5 above, the densities of the current flowing through the contact plugs $C_1$, $C_2$, which are relatively large in the comparative example, are reduced according to the fourth embodiment of the present invention.

5th embodiment:

In the first through fourth embodiments, the lower- and upper-layer interconnection extend in the same direction as each other, and the conductive paths provided by the contact plugs are classified into the two groups, i.e., the conductive path provided by the contact plugs $C_1$, $C_2$, and the conductive path provided by the contact plugs $C_3$, $C_4$. However, the conductive paths provided by the contact plugs are classified into three or more groups, as described below. According to a fifth embodiment of the present invention, as shown in FIGS. 3A and 3B, a joint structure for multilayer interconnections consists of a lower-layer interconnection 1 of Ti or W, an upper-layer interconnection 2 of Al extending perpendicularly to the direction in which the lower-layer interconnection 1 extends and overlaps the lower-layer interconnection 1 only at an end thereof, and four contact plugs $C_1$–$C_4$ by which the upper- and lower-layer interconnections are connected to each other in one joint region.

Figure 3A:
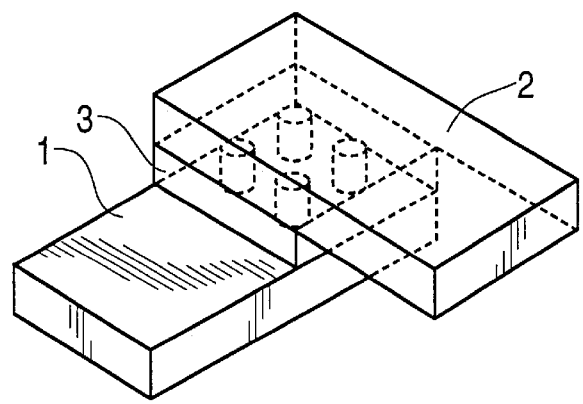
FIG. 3A is a perspective view of a joint structure for multilayer interconnections according to a fifth embodiment of the present invention.
Figure 3B:
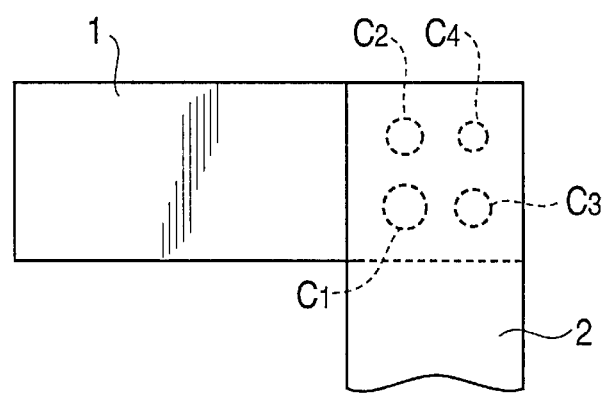
FIG. 3B is a plan view of the joint structure for multilayer interconnections shown in FIG. 3A.

As shown in FIGS. 3A and 3B, the lower-layer interconnection 1 and the upper-layer interconnection 2 are connected by four conductive paths which are provided in one joint region by the four contact plugs $C_1$, $C_2$, $C_3$, $C_4$ that are circular in shape when viewed in plan. The conductive path provided by the contact plug $C_1$ in the lower-layer interconnection 1 is shortest, and the contact plug $C_1$ has a radius of 0.35 $\mu$m. The conductive path provided by the contact plug $C_4$ in the lower-layer interconnection 1 is longest, and the contact plug $C_4$ has a radius of 0.25 $\mu$m. The other conductive path provided by the contact plugs $C_2$, $C_3$ in the lower-layer interconnection 1 is intermediate in length, and these contact plugs $C_2$, $C_3$ have a radius of 0.30 $\mu$m.

Figure 3C:
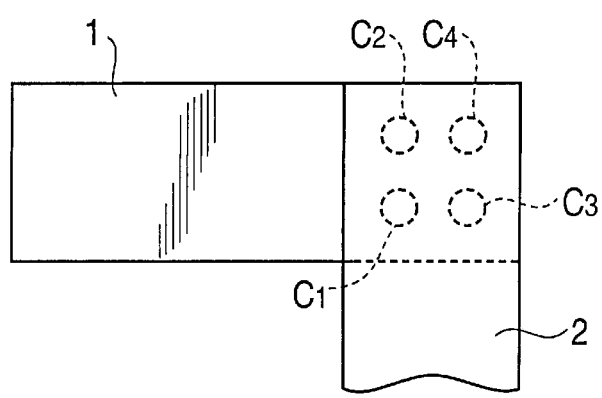
FIG. 3C is a plan view of a joint structure for multilayer interconnections according to a third comparative example.
Figure 4A:
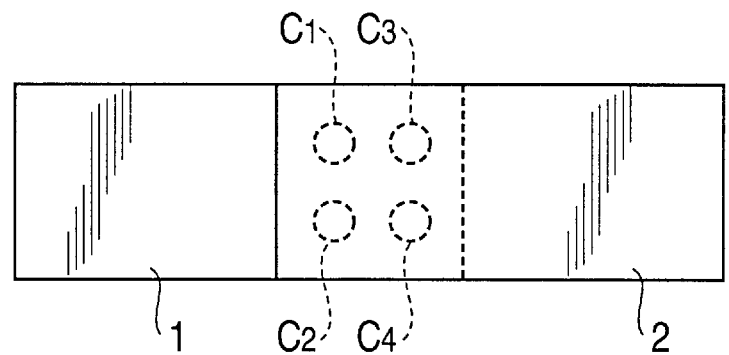
FIG. 4A is a plan view of a related art joint structure for multilayer interconnections.
Figure 4B:
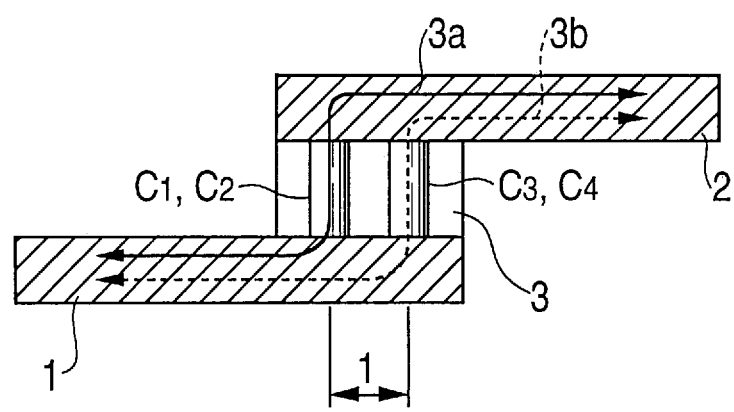
FIG. 4B is a cross-sectional view of the related art joint structure for multilayer interconnections shown in FIG. 4A.

FIG. 3C shows a comparative example which is similar to the joint structure for multilayer interconnections according to the fifth embodiment except that all the four contact plugs $C_1$, $C_2$, $C_3$, $C_4$ have a radius of 0.30 $\mu$m. The conductive path provided by the contact plug $C_1$ undergoes a largest current density, and hence the contact plug $C_1$ tends to be damaged most. The joint structure for multilayer interconnections according to the fifth embodiment, however, is effective to uniformize the current densities in the contact plugs $C_1$, $C_2$, $C_3$, $C_4$, thus avoiding such problem of the comparative example.

In the above embodiments, the lower-layer interconnection is made of a high-resistivity conductive material of Ti or W. However, lower-layer interconnection may be made of a refractory metal such as Mo (Molybdenum) or the like, or its silicide or polycide, or polycrystalline silicon with a high impurity content.

While the upper-layer interconnection is illustrated as being made of a conductive material of Al, it may be made of an aluminum alloy such as Al-Si (silicon), Al-Si-Cu (Copper), or the like, or may be made of Cu.

If the assembly is not required to be heated after the lower-layer interconnection formed, then the lower-layer interconnection may be made of an Al-based metal having a low melting point or Cu which is susceptible to oxidation, or may be in the form of a semiconductor substrate with an impurity-diffused layer or an embedded conductive layer.

The contact plugs are illustrated as being made of Al of which the upper-layer interconnection is made. They may be formed as contact plugs of W by a combination of blanket CVD (Chemical vapor Deposition) and etchback, or by selective CVD.

While the four contact plugs in one joint region are shown in the illustrated embodiments, two more contact plugs may be employed to connect the upper- and lower-layer interconnections. Therefore, the principles of the present invention are applicable to joint structures for multilayer interconnections where a plurality of conductive paths are provided by a plurality of contact plugs. The contact plugs that are used may be of any shape, such as a square shape, rather than a circular shape, when viewed in plan.

Although certain preferred embodiments of the present invention have been shown and described in detail, it should be understood that various changes and modifications may be made therein without departing from the scope of the appended claims.

What is claimed is:

1. A joint structure for multilayer interconnections, comprising:
    a lower-layer interconnection;
    an upper-layer interconnection, separated from said lower-layer interconnection by an interlayer insulating film; and
    a plurality of conductive contact plugs each of which extends through said interlayer insulating film to provide an electrical connection between said lower-layer interconnection and said upper-layer interconnection, said contact plugs being located such that at least a first plug and a second plug of said plurality of plugs provide, respectively, first and second current paths having unequal lengths;
    wherein said first current path is longer than said second current path and a first cross-section of said first plug has less area than a second cross-section of said second plug, said first and second cross-sections being coplanar.

2. A structure as claimed in claim 1, wherein said lower-layer interconnection and said upper-layer interconnection are made of different materials having different resitivities.

3. A structure as claimed in claim 1, wherein said lower-layer interconnection is made of Ti, W, Mo or an Mo alloy.

4. A structure as claimed in claim 1, wherein said upper-layer interconnection is made of Al or an Al alloy.

5. A joint structure for multilayer interconnections, comprising:
    a lower-layer interconnection;
    an upper-layer interconnection, separated from said lower-layer interconnection by an interlayer insulating film, wherein said upper-layer interconnection and said lower-layer interconnection extend parallel to each other; and
    a plurality of conductive contact plugs each of which extends through said interlayer insulating film to provide an electrical connection between said lower-layer interconnection and said upper-layer interconnection, wherein said contact plugs all have a substantially circular cross-section and are located such that at least a first plug and a second plug of said plurality of plugs provide, respectively, first and second current paths having unequal lengths;
    wherein said first current path is longer than said second current path and a cross-section of said first plug has less area than a cross-section of said second plug.

6. A structure as claimed in claim 5, wherein:
    the cross-section of said first plug has a radius of 0.25 $\mu$m; and
    the cross-section of said second plug has a radius of 0.35 $\mu$m.

7. A structure as claimed in claim 5, wherein:
    said plurality of plugs comprises four plugs;
    said four plugs are located such that a first plug and a third plug each provide said first current path which is longer than said second current path provided by each of a second plug and a fourth plug;
    a cross-section of said first plug is equal to a cross-section of said third plug;
    a cross-section of said second plug is equal to a cross-section of said fourth plug; and
    the cross-sections of said first and third plugs has less area than the cross-sections of said second and fourth plugs.

8. A joint structure for multilayer interconnections, comprising:
    a lower-layer interconnection;
    an upper-layer interconnection, separated from said lower-layer interconnection by an interlayer insulating film, wherein said upper-layer interconnection extends perpendicular to said lower-layer interconnection; and
    a plurality of conductive contact plugs each of which extends through said interlayer insulating film to provide an electrical connection between said lower-layer interconnection and said upper-layer interconnection, wherein said contact plugs all have a substantially circular cross-section and are located such that at least a first plug and a second plug of said plurality of plugs provide, respectively, first and second current paths having unequal lengths;
    wherein said first current path is longer than said second current path and a cross-section of said first plug has less area than a cross-section of said second plug.

9. A structure as claimed in claim 8, wherein:
    said plurality of plugs comprises four plugs; and
    a third plug and a fourth plug of said plurality of plugs provide current paths which are equal in length and have a length which is less than said first current path and greater than said second current path.

10. A structure as claimed in claim 9, wherein cross-sections of said third and fourth plugs are:

equal in area;

greater in area than said cross-section of said first plug; and smaller in area than said cross-section of said second plug.

11. A structure as claimed in claim 10, wherein:

the cross-section of said third and fourth plugs has a radius of 0.30 $\mu$m;

the cross-section of said first plug has a radius of 0.25 $\mu$m; and the cross-section of said second plug has a radius of 0.35 $\mu$m.

* * * * *